United States Patent
Zhou et al.

(10) Patent No.: US 10,930,871 B2
(45) Date of Patent: Feb. 23, 2021

(54) LIGHT EMITTING DEVICE AND METHOD FOR MANUFACTURING THE SAME, AND DISPLAY DEVICE

(71) Applicant: BOE TECHNOLOGY GROUP CO., LTD., Beijing (CN)

(72) Inventors: Qingchao Zhou, Beijing (CN); Shengji Yang, Beijing (CN); Xiaochuan Chen, Beijing (CN); Qing Wang, Beijing (CN); Luyang Zhou, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/378,816

(22) Filed: Apr. 9, 2019

(65) Prior Publication Data

US 2020/0075891 A1 Mar. 5, 2020

(30) Foreign Application Priority Data

Aug. 29, 2018 (CN) .......................... 201810992811.2

(51) Int. Cl.
*H01L 51/50* (2006.01)
*H01L 51/52* (2006.01)
(Continued)

(52) U.S. Cl.
CPC ............ *H01L 51/50* (2013.01); *H01L 27/322* (2013.01); *H01L 51/5246* (2013.01);
(Continued)

(58) Field of Classification Search
CPC ............. H01L 51/5246; H01L 51/5265; H01L 51/5271; H01L 51/50
See application file for complete search history.

(56) References Cited

U.S. PATENT DOCUMENTS 6,897,474 B2 * 5/2005 Brown ................ H01L 51/5246
257/40
7,071,619 B2 * 7/2006 Iwase ................. H01L 51/5246
313/512
(Continued)

FOREIGN PATENT DOCUMENTS

CN 105633294 A 6/2016
CN 107667441 A 2/2018
(Continued)

OTHER PUBLICATIONS

First Office Action for CN Appl. No. 201810992811.2, dated Nov. 25, 2019.
(Continued)

*Primary Examiner* — Jose R Diaz
(74) *Attorney, Agent, or Firm* — The Webb Law Firm (57) ABSTRACT

The present disclosure provides a light emitting device and a method for manufacturing the same, and a display device, and relates to the field of display technology. The light emitting device includes: a light emitting unit; an encapsulating layer located on one side of the light emitting unit, wherein the encapsulating layer includes a reflective layer; an adhesive layer located on one side of the encapsulating layer away from the light emitting unit, wherein the adhesive layer includes an adhesive material; and a color filter layer located on one side of the adhesive layer away from the encapsulating layer, wherein the reflective layer is configured to reflect a light that cures the adhesive material.

19 Claims, 4 Drawing Sheets

(51) Int. Cl.
    *H01L 51/56*     (2006.01)
    *H01L 27/32*     (2006.01)

(52) U.S. Cl.
    CPC ...... *H01L 51/5256* (2013.01); *H01L 51/5265* (2013.01); *H01L 51/5271* (2013.01); *H01L 51/56* (2013.01)

(56) References Cited

U.S. PATENT DOCUMENTS

2007/0216300 A1     9/2007   Lee et al.
2010/0019654 A1     1/2010   Hayashi

FOREIGN PATENT DOCUMENTS

| CN | 108054290 A | 5/2018 |
| CN | 108242483 A | 7/2018 |

OTHER PUBLICATIONS

Second Office Action for CN Appl. No. 201810992811.2, dated Apr. 14, 2020.

\* cited by examiner

LIGHT EMITTING DEVICE AND METHOD FOR MANUFACTURING THE SAME, AND DISPLAY DEVICE

CROSS-REFERENCE TO RELATED APPLICATIONS

The present application claims priority to China Patent Application No. 201810992811.2 filed on Aug. 29, 2018, the disclosure of which is incorporated by reference herein in its entirety.

TECHNICAL FIELD

The present disclosure relates to the technical field of display, and especially to a light emitting device and a method for manufacturing the same, and a display device.

BACKGROUND

The OLED (Organic Light-Emitting Diode) is a light emitting device developed in recent years. The OLED display with high PPI (Pixels Per Inch), and high refresh rate may be manufactured in silicon-based semiconductor process and applied in the fields of virtual reality or augmented reality.

One manner to achieve colorization of an OLED is by Using a white OLED and a color filter layer. In order to obtain an OLED display with high resolution, a LTCF (Low Temperature Color Filter) process is often used at present to form a color filter layer.

SUMMARY

According to one aspect of embodiments of the present disclosure, a light emitting device is provided. The light emitting device comprises: a light emitting unit; an encapsulating layer located on one side of the light emitting unit, wherein the encapsulating layer comprises a reflective layer; an adhesive layer located on one side of the encapsulating layer away from the light emitting unit, wherein the adhesive layer comprises an adhesive material; and a color filter layer located on one side of the adhesive layer away from the encapsulating layer, wherein the reflective layer is configured to a light that cures the adhesive material.

In some embodiments, the reflective layer comprises a distributed Bragg reflector.

In some embodiments, the distributed Bragg reflector comprises at least two stacks, each of which comprises a silicon oxide layer and a silicon nitride layer.

In some embodiments, the silicon nitride layer is located on one side of the silicon oxide layer away from the light emitting unit.

In some embodiments, the silicon nitride layer has a thickness greater than a thickness of the silicon oxide layer.

In some embodiments, a ratio of the thickness of the silicon nitride layer to the thickness of the silicon oxide layer is less than or equal to 1.3.

In some embodiments, the distributed Bragg reflector comprises three stacks.

In some embodiments, the light comprises an ultraviolet light.

In some embodiments, the encapsulating layer comprises a first barrier layer, a second barrier layer, and a buffer layer therebetween.

In some embodiments, one of the first barrier layer, the second barrier layer, and the buffer layer is located at a same layer as the reflective layer.

In some embodiments, one of the first barrier layer and the second barrier layer is located in the same layer as the reflective layer.

In some embodiments, any one of the first barrier layer, the second barrier layer, and the buffer layer is located at a different layer from the reflective layer.

In some embodiments, a material of each of the first barrier layer and the second barrier layer comprises an inorganic material; a material of the buffer layer comprises an organic material.

In some embodiments, the silicon oxide layer has a thickness of about 45 nm to about 55 nm; the silicon nitride layer has a thickness of about 50 nm to about 60 nm.

In some embodiments, the light emitting unit comprises a first electrode, a second electrode, and a light emitting layer therebetween.

In some embodiments, the adhesive material comprises glue.

In some embodiments, the light emitting device further comprises: a protective layer located on one side of the color filter layer away from the adhesive layer.

According to another aspect of embodiments of the present disclosure, a display device is provided. The display device comprises the light emitting device according to any one of the above embodiments.

According to still another aspect of embodiments of the present disclosure, a method for manufacturing a light emitting device is provided. The method comprises: forming an encapsulating layer on one side of a light emitting unit, wherein the encapsulating layer comprises a reflective layer; forming an adhesive material on one side of the encapsulating layer away from the light emitting unit; curing the adhesive material by a light to form an adhesive layer, wherein the reflective layer is used for reflecting the light; forming a color filter layer on one side of the adhesive layer away from the encapsulating layer.

In some embodiments, the light comprises an ultraviolet light.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure can be understood more clearly from the following detailed description with reference to the accompanying drawings, in which.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors have noticed that the low temperature color filter process results in a poor adhesion between a color filter layer and an encapsulating layer below the color filter layer. Therefore, the reliability of the OLED device is decreased.

Accordingly, it is typically necessary to additionally add an adhesive layer between the color filter layer and the encapsulating layer.

However, the inventors have found that the OLED device tends to have deteriorating luminescent properties after being additionally added the adhesive layer. The inventors have further studied and found that: the adhesive layer is formed by an ultraviolet curing process, and the ultraviolet irradiation may cause damage to the light emitting layer in the OLED, thereby deteriorating the luminescent properties of the OLED device.

In order to solve the above problem, the embodiments of the present disclosure provide the following technical solutions.

Figure 1:
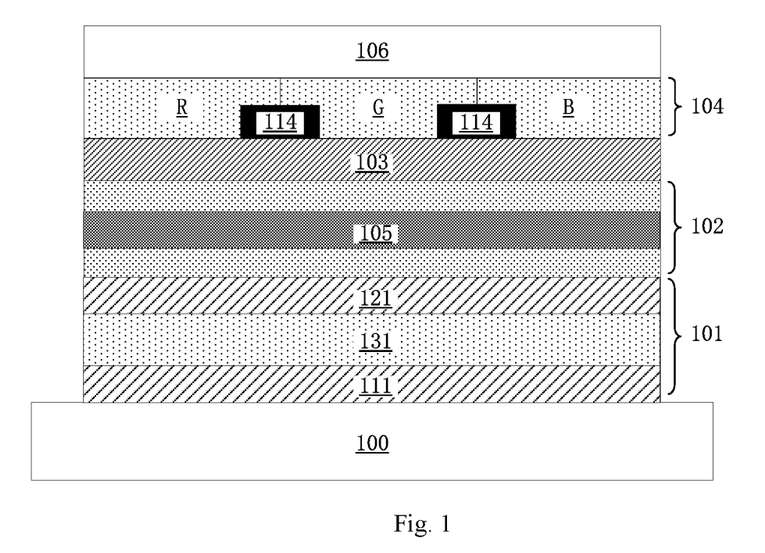
FIG. 1 is a schematic structural view showing a light emitting device according to an embodiment of the present disclosure.

FIG. 1 is a schematic structural view showing a light emitting device according to an embodiment of the present disclosure.

As shown in FIG. 1, the light emitting device comprises a light emitting unit 101, an encapsulating layer 102, an adhesive layer 103, and a color filter layer 104 on one side of a substrate 100 (for example, a silicon substrate).

The light emitting unit 101 may comprise, for example, a first electrode 111, a second electrode 121, and a light emitting layer 131 between the first electrode 111 and the second electrode 121. The light emitting layer 131 comprises a layer of luminescent material such as a layer of organic luminescent material. The light emitting layer 131 may further comprise one or more layers of an electron transport layer, a hole transport layer, an electron injection layer, and a hole injection layer.

The encapsulating layer 102 is located on one side of the light emitting unit 101 (shown as an upper side in FIG. 1). The encapsulating layer 102 comprises a reflective layer 105. Here, it should be understood that the light emitted by the light emitting unit 101 can pass through the reflective layer 105. In some embodiments, the encapsulating layer 102 may comprise a thin film encapsulating layer (TFE).

The adhesive layer 103 is located on one side of the encapsulating layer 102 away from the light emitting unit 101, and comprises an adhesive material. The reflective layer 105 is configured to reflect a light, for example an ultraviolet light, which cures the adhesive material. For example, the adhesive material may comprise a glue material.

The color filter layer 104 is located on one side of the adhesive layer 103 away from the encapsulating layer 102. The color filter layer 104 may comprise, for example, a red color filter R, a green color filter G, and a blue color filter B. A black matrix 114 may be disposed between adjacent filters.

In some embodiments, the light emitting device may further comprise a protective layer 106 located on the color filter layer 104, such as an organic layer, an inorganic layer, or a stack composed of an organic layer and an inorganic layer.

In the above embodiments, the adhesive layer comprises an adhesive material, and the encapsulating layer comprises a reflective layer configured to reflect the light that cures the adhesive material. The reflective layer can reflect the light that cures the adhesive material to one side of the encapsulating layer away from the light emitting unit. The adverse effect on the light emitting unit by the light that cures the adhesive material is reduced, and the luminescent performance of the light emitting device is improved. In addition, the adhesive material may be further cured by the reflected light, thus the curing time can be saved.

Figure 2:
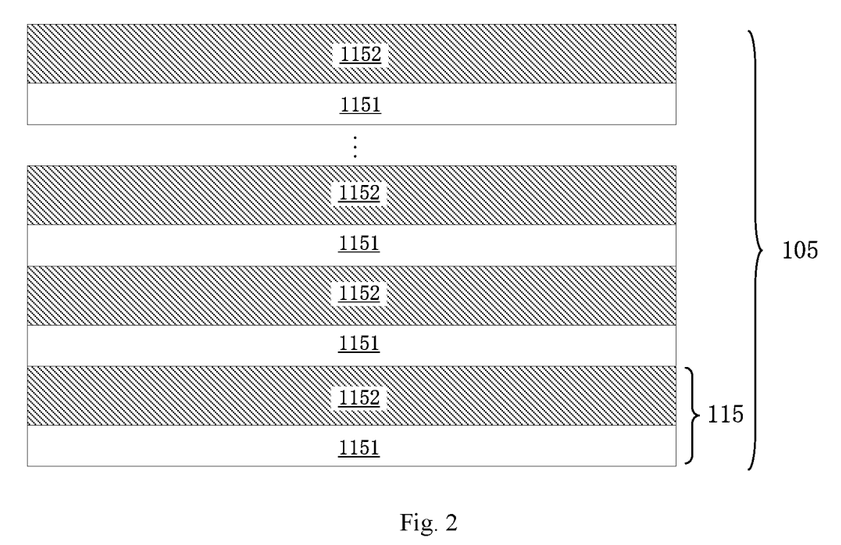
FIG. 2 is a schematic structural view of a reflective layer according to an implementation of the present disclosure.

FIG. 2 is a schematic structural view showing a reflective layer according to an implementation of the present disclosure.

As shown in FIG. 2, the reflective layer 105 may comprise a distributed Bragg reflector (DBR). In some embodiments, the distributed Bragg reflector comprises at least two stacks 115, each of which comprises a silicon oxide layer 1151 (e.g., $SiO_2$) and a nitride silicon layer 1152 (e.g., $SiN_x$).

In one or more embodiments, the number of the stacks 115 in the distributed Bragg reflector, the relative positions of the silicon oxide layer 1151 and the silicon nitride layer 1152 in the stacks 115, as well as the thicknesses of the silicon oxide layer 1151 and the silicon nitride layer 1152 in the stacks 115 may be optimized to achieve a high reflectance of the reflective layer 105 to the light that cures the adhesive material and a high transmittance of the reflective layer 105 to the light emitted by the light emitting unit 101.

For example, the distributed Bragg reflector may comprise three, four, or five stacks, or the like. In some embodiments, the distributed Bragg reflector may comprise three stacks 115. In a case where the distributed Bragg reflector comprises three stacks 115, the reflectance of the reflective layer 105 to the light that cures the adhesive material, the transmittance of the reflective layer 105 to the light emitted from the light emitting unit 101, and the process cost can be balanced.

In some implementations, the silicon oxide layer 1151 in each stack 115 is located on one side of the silicon nitride layer 1152 away from the light emitting unit 101, that is, the silicon oxide layer 1151 is located on the silicon nitride layer 1152.

In other implementations, as shown in FIG. 2, the silicon nitride layer 1152 in each stack 115 is located on one side of the silicon oxide layer 1151 away from the light emitting unit 101, that is, the silicon nitride layer 1152 is located on the silicon oxide layer 1151. Such a structure is more advantageous for improving the reflectance of the reflective layer 105 to the light that cures the adhesive material and the transmittance of the reflective layer 105 to the light emitted from the light emitting unit 101, so that the adverse effect on the light emitting unit 101 by the light that cures the adhesive material can be further reduced, and the luminescent properties of the light emitting device can be further improved without decreasing the luminescent brightness of the light emitting unit 101.

In at least one embodiment, the silicon nitride layer 1152 is on one side of the silicon oxide layer 1151 away from the light emitting unit 101, and the silicon nitride layer 1152 has a thickness greater than a thickness of the silicon oxide layer 1151. Such a structure is further more advantageous for improving the reflectance of the reflective layer 105 to the light that cures the adhesive material and the transmittance of the reflective layer 105 to the light emitted from the light emitting unit 101, so that the adverse effect on the light emitting unit 101 by the light that cures the adhesive material can be still further reduced, and the luminescent properties of the light emitting device can be still further improved without decreasing the luminescent brightness of the light emitting unit 101. For example, the ratio of the thickness of the silicon nitride layer 1152 to the thickness of the silicon oxide layer 1151 is greater than 1, and less than or equal to 1.3, for example, may be about 1.1, about 1.2, or the like. For example, on the premise that the silicon nitride layer 1152 has a thickness greater than a thickness of the silicon oxide layer 1151, the silicon oxide layer 1151 may have a thickness of about 45 nm to about 55 nm, for example, about 43 nm, about 50 nm, about 52 nm, or the like; the silicon nitride layer 1152 may have a thickness of about 50 nm to about 60 nm, for example, about 53 nm, about 55 nm, about 57 nm, or the like.

In some embodiments, the encapsulating layer 102 may comprise a plurality of layers, and the positional relationship between various layers in the encapsulating layer 102 and the reflective layer 105 may be implemented in different ways. The details will be introduced below with reference to FIGS. 3A-3C.

Figure 3A:
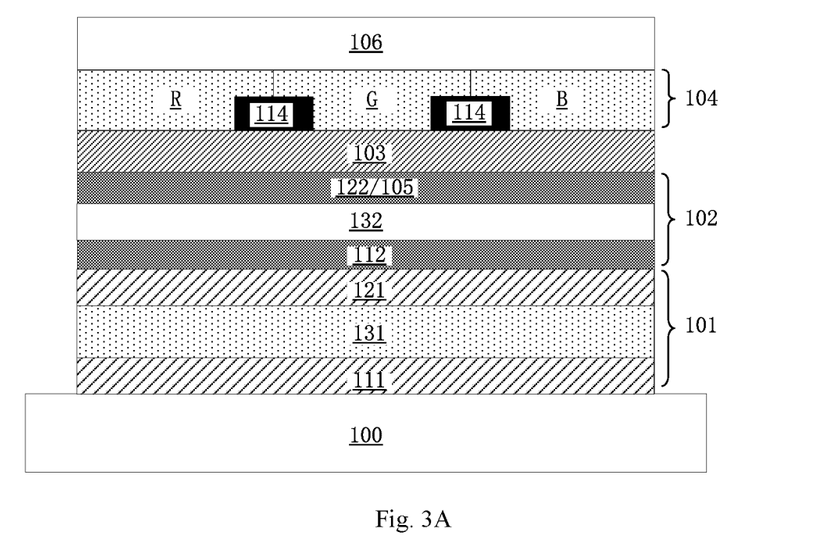
FIGS. 3A-3C are schematic structural views showing light emitting devices according to different implementations of the present disclosure.
Figure 3B:
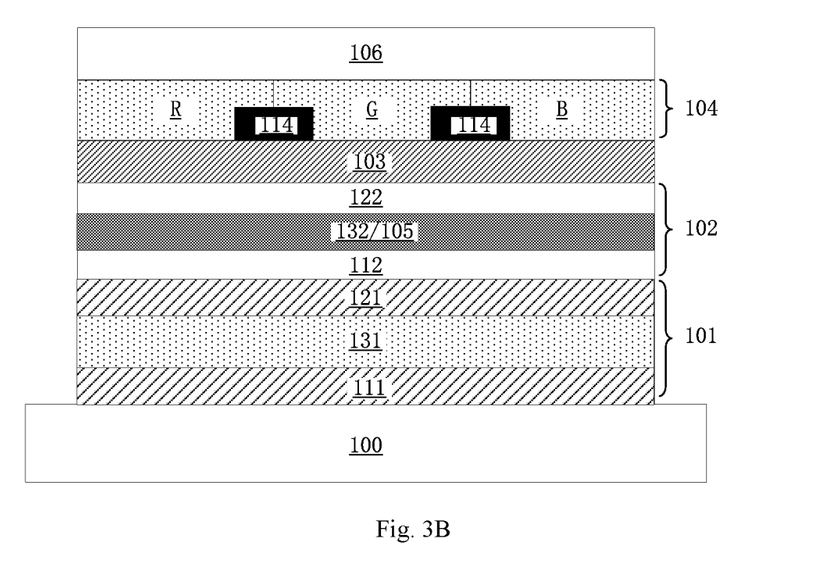
Figure 3C:
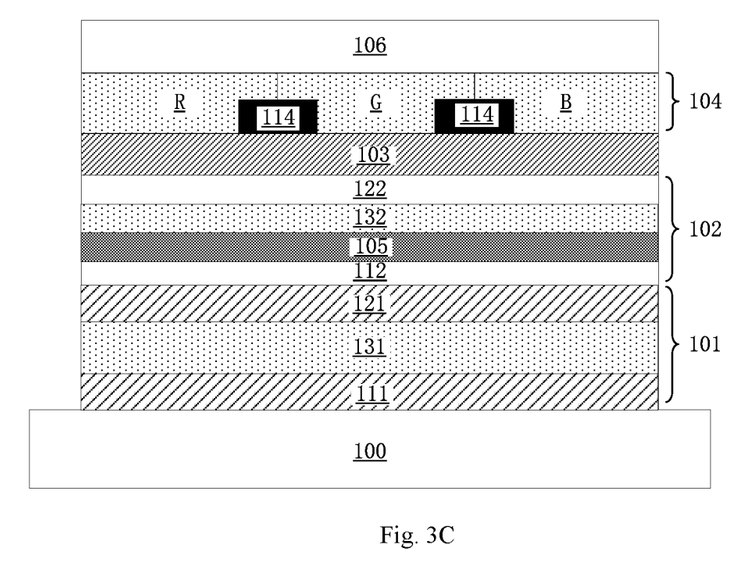

FIGS. 3A-3C are schematic structural views showing light emitting devices according to different implementations of the present disclosure.

As shown in FIGS. 3A-3C, the encapsulating layer 102 may comprise a first barrier layer 112, a second barrier layer 122, and a buffer layer 132 between the first barrier layer 112 and the second barrier layer 122. The first barrier layer 112 and the second barrier layer 122 are used for blocking at least one of water or oxygen. The buffer layer 132 is used for reducing stress between the first barrier layer 112 and the second barrier layer 122.

In one or more embodiments, the material of each of the first barrier layer 112 and the second barrier layer 122 may comprise an inorganic material such as a silicon oxide, a silicon nitride, or a silicon oxynitride, or the like. In one or more embodiments, the material of the buffer layer 132 may comprise an organic material such as hexamethyldisiloxane (HMDSO), or the like.

In some implementations, one of the first barrier layer 112, the second barrier layer 122, and the buffer layer 132 may be located at the same layer as the reflective layer 105. In other implementations, any one of the first barrier layer 112, the second barrier layer 122, and the buffer layer 132 is located at a different layer from the reflective layer 105.

For example, as shown in FIG. 3A, one of the first barrier layer 112 and the second barrier layer 122 (e.g., the second barrier layer 122) is located at the same layer as the reflective layer 105. In such a structure, one of the barrier layers in the encapsulating layer 102 may serve as a reflective layer 105 without other layers additionally added. Thus, the thickness of the light emitting device may be reduced.

For another example, as shown in FIG. 3B, the buffer layer 132 is located at the same layer as the reflective layer 105. In such a structure, the buffer layer 132 may serve as a reflective layer 105 without other layers additionally added. Thus, the thickness of the light emitting device may be reduced.

For still another example, as shown in FIG. 3C, any one of the first barrier layer 112, the second barrier layer 122, and the buffer layer 132 is located at a different layer from the reflective layer 105. It should be noted that, although the reflective layer 105 in FIG. 3C is shown to be located between the first barrier layer 112 and the buffer layer 132, this is not meant as a limitation of the present disclosure. It should be understood that, the reflective layer 105 may be located between any two layers in the encapsulating layer 102, or between the first barrier layer 112 and the light emitting unit 101, or between the second barrier layer 122 and the adhesive layer 103.

The present disclosure also provides a display device, which may comprise the light emitting device, for example an OLED device, of any one of the above embodiments. In some embodiments, the display device may be any product or member having a display function, such as a display panel, a mobile terminal, a television, a display, a notebook computer, a digital photo frame, a navigator, or an electronic paper.

Figure 4:
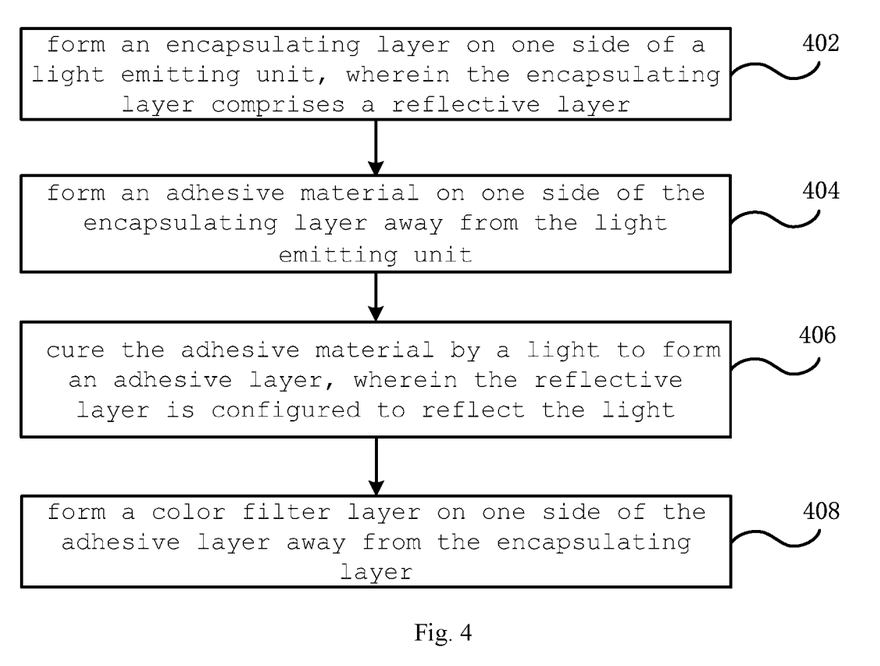
FIG. 4 is a schematic flow chart showing a method for manufacturing a light emitting device according to an embodiment of the present disclosure.

FIG. 4 is a schematic flow chart showing a method for manufacturing a light emitting device according to an embodiment of the present disclosure.

At step 402, an encapsulating layer is formed on one side of a light emitting unit, wherein the encapsulating layer comprises a reflective layer.

The light emitting unit may comprise a first electrode, a second electrode, and a light emitting layer between the first electrode and the second electrode. In some embodiments, the reflective layer may comprise, for example, a distributed Bragg reflector as shown in FIG. 2.

At step 404, an adhesive material is formed on one side of the encapsulating layer away from the light emitting unit.

In some implementations, the adhesive material may comprise glue.

At step 406, the adhesive material is cured by a light to form an adhesive layer. The reflective layer is configured to reflect the light that cures the adhesive material.

For example, the adhesive material may be irradiated and cured to form an adhesive layer with an ultraviolet light. When the adhesive material is irradiated with an ultraviolet light, the ultraviolet light may be reflected, by the reflective layer, to one side of the encapsulating layer away from the light emitting unit. Those skilled in the art will appreciate that different adhesive materials may be cured by different wavelengths of light correspondingly.

At step 408, a color filter layer is formed on one side of the adhesive layer away from the encapsulating layer.

For example, a color filter layer may be formed by a low temperature color filter process.

In the above embodiments, the formed encapsulating layer comprises a reflective layer. When the adhesive material is cured with a light, the reflective layer may reflect the light that cures the adhesive material to one side of the encapsulating layer away from the light emitting unit. The adverse effect on the light emitting unit by the light that cures the adhesive material is reduced, and the luminescent performance of the light emitting device is improved. In addition, the adhesive material may be further cured by the reflected light, thus the curing time can be saved.

Figure 5:
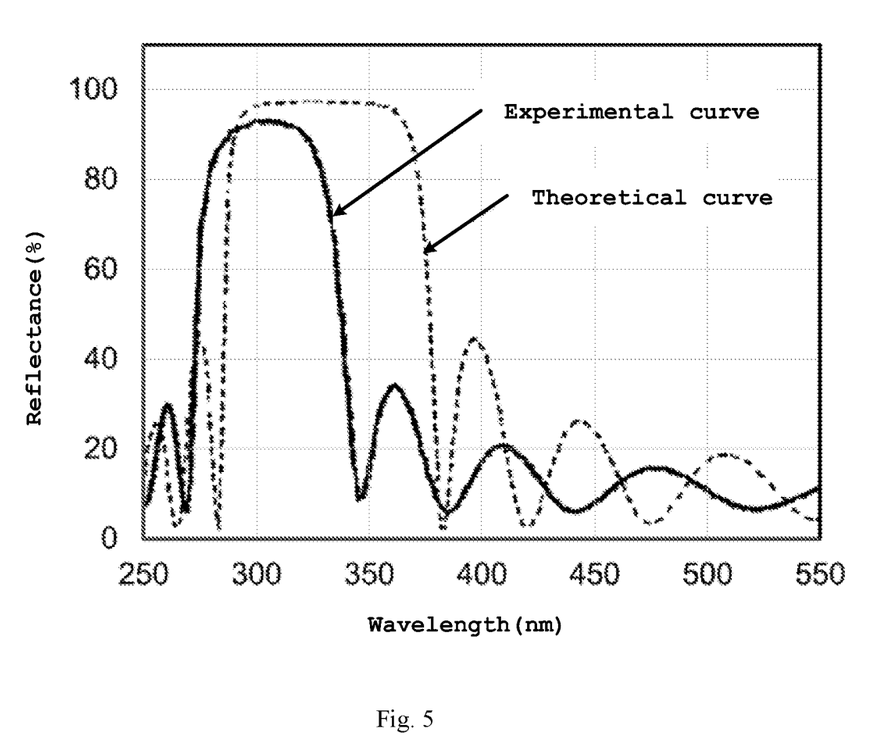
FIG. 5 shows a schematic view showing a relationship between a reflectance of an encapsulating layer and a wavelength of light according to an example of the present disclosure.

FIG. 5 shows a schematic view showing a relationship between a reflectance of an encapsulating layer and a wavelength of light according to an example of the present disclosure. In this example, the reflective layer in the encapsulating layer is a distributed Bragg reflector comprising at least two stacks 115 (see FIG. 2).

According to the theoretical curve and the experimental curve of the relationship between the reflectance and the wavelength of a light as shown in FIG. 5, it can be known that the reflectance of the encapsulating layer to the ultraviolet light is greater than 90%. Therefore, in a case where the light that cures the adhesive material is an ultraviolet light, the reflective layer may reflect most of the ultraviolet light, so that the adverse effect on the light emitting unit may be reduced.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A light emitting device, comprising:
    a light emitting unit;
    an encapsulating layer located on one side of the light emitting unit, wherein the encapsulating layer comprises a reflective layer;
    an adhesive layer located on one side of the encapsulating layer away from the light emitting unit, wherein the adhesive layer comprises an adhesive material; and
    a color filter layer located on one side of the adhesive layer away from the encapsulating layer,
    wherein the reflective layer is configured to reflect a light that cures the adhesive material, and
    wherein the encapsulating layer comprises a first barrier layer, a second barrier layer, and a buffer layer therebetween.

2. The light emitting device according to claim 1, wherein the reflective layer comprises a distributed Bragg reflector.

3. The light emitting device according to claim 2, wherein the distributed Bragg reflector comprises at least two stacks, each of which comprises a silicon oxide layer and a silicon nitride layer.

4. The light emitting device according to claim 3, wherein the silicon nitride layer is located on one side of the silicon oxide layer away from the light emitting unit.

5. The light emitting device according to claim 4, wherein the silicon nitride layer has a thickness greater than a thickness of the silicon oxide layer.

6. The light emitting device according to claim 5, wherein a ratio of the thickness of the silicon nitride layer to the thickness of the silicon oxide layer is less than or equal to 1.3.

7. The light emitting device according to claim 5, wherein:
    the silicon oxide layer has a thickness of about 45 nm to about 55 nm;
    the silicon nitride layer has a thickness of about 50 nm to about 60 nm.

8. The light emitting device according to claim 3, wherein the distributed Bragg reflector comprises three stacks.

9. The light emitting device according to claim 1, wherein the light comprises an ultraviolet light.

10. The light emitting device according to claim 1, wherein one of the first barrier layer, the second barrier layer, and the buffer layer is located at a same layer as the reflective layer.

11. The light emitting device according to claim 10, wherein one of the first barrier layer and the second barrier layer is located in the same layer as the reflective layer.

12. The light emitting device according to claim 1, wherein any one of the first barrier layer, the second barrier layer, and the buffer layer is located at a different layer from the reflective layer.

13. The light emitting device according to claim 1, wherein:
    a material of each of the first barrier layer and the second barrier layer comprises an inorganic material; and
    a material of the buffer layer comprises an organic material.

14. The light emitting device according to claim 1, wherein the light emitting unit comprises a first electrode, a second electrode, and a light emitting layer therebetween.

15. The light emitting device according to claim 1, wherein the adhesive material comprises glue.

16. The light emitting device according to claim 1, further comprising:
- a protective layer located on one side of the color filter layer away from the adhesive layer.

17. A display device, comprising the light emitting device according to claim 1.

18. A method for manufacturing a light emitting device, comprising:
- forming an encapsulating layer on one side of a light emitting unit, wherein the encapsulating layer comprises a reflective layer;
- forming an adhesive material on one side of the encapsulating layer away from the light emitting unit;
- curing the adhesive material by a light to form an adhesive layer, wherein the reflective layer is configured to reflect the light; and
- forming a color filter layer on one side of the adhesive layer away from the encapsulating layer,
- wherein the encapsulating layer comprises a first barrier layer, a second barrier layer, and a buffer layer therebetween.

19. The method according to claim 18, wherein the light comprises an ultraviolet light.

* * * * *